US008791705B2

(12) United States Patent
Zelder et al.

(10) Patent No.: US 8,791,705 B2

(45) Date of Patent: Jul. 29, 2014

(54) MEASUREMENT ARRANGEMENT HAVING A CALIBRATION SUBSTRATE AND ELECTRONIC CIRCUIT

(75) Inventors: Thomas Zelder, Luneberg (DE); Bernd Geck, Hannover (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 513 days.

(21) Appl. No.: 13/123,114

(22) PCT Filed: Sep. 29, 2009

(86) PCT No.: PCT/EP2009/007009

§ 371 (c)(1), (2), (4) Date: Jul. 1, 2011

(87) PCT Pub. No.: WO2010/043309

PCT Pub. Date: Apr. 22, 2010

(65) Prior Publication Data

US 2011/0254536 A1 Oct. 20, 2011

(30) Foreign Application Priority Data

Oct. 15, 2008 (DE) ..................... 20 2008 013 687 U

(51) Int. Cl.

| | |
|---|---|
| ***G01R 35/04*** | (2006.01) |
| ***G01R 27/32*** | (2006.01) |
| ***G01R 35/00*** | (2006.01) |
| ***G01D 18/00*** | (2006.01) |

(52) U.S. Cl.

CPC .............. *G01R 27/32* (2013.01); *G01R 35/005* (2013.01); *G01D 18/00* (2013.01)

USPC ................. 324/601; 324/757.01; 324/762.01; 702/85

(58) Field of Classification Search

CPC ....... G01R 27/32; G01R 35/005; G01D 18/00

USPC ............ 324/73.1, 74, 601, 637–646, 757.02, 324/762.01; 702/85–107

See application file for complete search history.

(56) References Cited

U.S. PATENT DOCUMENTS

| | | | | |
|---|---|---|---|---|
| 5,578,932 | A * | 11/1996 | Adamian | 324/601 |
| 6,249,128 | B1 * | 6/2001 | Begg | 324/601 |
| 7,068,049 | B2 * | 6/2006 | Adamian | 324/638 |
| 2003/0132758 | A1 | 7/2003 | Martens | |

FOREIGN PATENT DOCUMENTS

EP 0678749 A 10/1995

OTHER PUBLICATIONS

Will B. et al., Fully Automated Measurements of Calibrated Scattering Parameters of Multi-Ports With a Two-Port Network Analyzer, Microwave Conference 2007, European IEEE, PI, Oct. 1, 2007, pp. 242-245.

Stenarson J. et al., In-Circuit Non-Contacting, S-Parameter Measurement for Planar Circuits, 19th ARFTG Conference Digest-Spring, May 1, 2001, pp. 1-4.

* cited by examiner

*Primary Examiner* — Arleen M. Vazquez

*Assistant Examiner* — Robert P Alejnikov, Jr.

(74) *Attorney, Agent, or Firm* — Robert Curcio; DeLio, Peterson & Curcio, LLC

(57) ABSTRACT

A calibration substrate having at least one calibration standard with at least two electrical connection points, each for one measurement gate of a vector network analyzer. At least one electrical connection point is formed of at least one calibration standard having a switch, wherein the switch has a first electrical contact electrically connected to an electrical connection point of the calibration standard, a second electrical contact designed for electrically connecting to a measurement gate of the vector network analyzer, and a third electrical contact, wherein the switch is designed such that an electrical contact is established either between the first and third electrical contact or between the first and second electrical contact.

19 Claims, 4 Drawing Sheets

38 40 42 36 18 32 12 32 26 20 22 26 34 30 30 34 14 26 20 22 26 16 26 20 22 26 18 18 100

38
40
42
36
18
32
12
32
26
20
22
26
34
30
30
34
14
26
20
22
26
16
26
20
22
26
18
18
100

36
32
18
18
30
34

32
18
18
30
34

36
18
32
18
30
34

40
42
38
36
32
218
212
214
210
20
22
30
34
200

40
42
38
36
32
218
28
20
20a
22
22a
210
212
214
30
34
300

MEASUREMENT ARRANGEMENT HAVING A CALIBRATION SUBSTRATE AND ELECTRONIC CIRCUIT

This application is a National Stage filing based on PCT/EP2009/007009, filed Sep. 29, 2009, and which claims priority to German Patent Application No. DE 20 2008 013 687.3, filed Oct. 15, 2008.

BACKGROUND OF THE INVENTION

1. Field of the Invention

The present invention relates to a calibration substrate having at least one calibration standard, comprising at least two electrical connection points, each for one measurement port of a vector network analyzer. The invention also relates to an electronic circuit with at least one electrical device under test (DUT) embedded in the electronic circuit, having electrical contact points which are electrically connected to the electronic circuit. The invention further relates to a measurement arrangement comprising the calibration substrate and the electronic circuit. The invention further relates to a method for determining scattering parameters of an electrical device under test (DUT), which comprises one or more electronic components which are electrically connected to one another, using a vector network analyzer, wherein the electrical device under test is embedded in an electronic circuit, wherein at least one, particularly two, ports of the vector network analyzer are electrically connected to a calibration substrate which comprises at least one calibration standard, and the vector network analyzer is calibrated, wherein subsequently the calibration substrate is disconnected from the vector network analyzer and the at least one port is electrically connected to an electrical contact point of the electronic circuit.

2. Description of Related Art

In the development of, for example, complex planar microwave circuits, which are built up from a plurality of subsidiary circuits, it is useful to determine the scattering parameters separately for each subsidiary circuit or, if appropriate, for individual electronic components. In this way, the efficiency of the various subsidiary circuits or electronic components can be individually analyzed and tested.

Determination of the scattering parameters of an electrical device under test (DUT) is carried out with a vector network analyzer (VNA). The disadvantage of vector network analysis is that non-destructive measurement of embedded devices under test (DUT) can only be carried out with great effort, since for each measurement of an embedded DUT, the electrical periphery must also be taken into account during the calibration.

SUMMARY OF THE INVENTION

Bearing in mind the problems and deficiencies of the prior art, it is therefore an object of the present invention to provide a calibration substrate, an electronic circuit and a measurement arrangement of the aforementioned type with regard to determining scattering parameters of an electrical device under test which is embedded in an electronic circuit.

This aim is achieved according to the invention by means of a calibration substrate of the aforementioned type having the characterizing features defined herein, by means of an electronic circuit of the aforementioned type defined herein, and by means of a measurement arrangement of the aforementioned type having the characterizing features defined herein. Advantageous embodiments of the invention are described in the claims.

Still other objects and advantages of the invention will in part be obvious and will in part be apparent from the specification.

The above and other objects, which will be apparent to those skilled in the art, are achieved in the present invention which is directed to a calibration substrate having at least one calibration standard comprising at least two electrical connection points, each for one measurement port of a vector network analyzer, at least one of the at least two electrical connection points of the at least one calibration standard including a switch, wherein the switch comprises: one first electrical contact which is electrically connected to an electrical connection point of the calibration standard; a second electrical contact which is configured for electrically connecting to a measurement port of the vector network analyzer; and a third electrical contact, wherein the switch is configured such that with the second electrical contact free and electrically connected to nothing, the switch makes an electrical connection between the first and third electrical contacts; wherein an electrical connection between the second and first electrical contacts and between the second and third electrical contacts is broken, and that with the second electrical contact electrically connected to the measurement port of the vector network analyzer, the switch breaks the electrical connection between the third and first electrical contacts and makes an electrical connection between the first and second electrical contacts, wherein an electrical connection between the third electrical contact and the second electrical contact is broken.

The calibration substrate may further comprise a circuit board, printed circuit board, or wafer, or any combination thereof, and the calibration standard having the at least one switch as an integrated circuit on the circuit board, the printed circuit board, or the wafer, or any combination thereof.

The third electrical contact of the switch may be electrically connected to an HF terminating resistor or a power transition.

The switch may be configured such that switching over of the electrical connections, when the second electrical contact is connected to or disconnected from the measurement port of the vector network analyzer, is performed electrically, mechanically, or optically, or any combination thereof.

The switch may further be configured such that switching over of the electrical connections, when the second electrical contact is connected to or disconnected from the measurement port of the vector network analyzer, is performed by applying a predetermined electrical voltage.

In a second aspect, the present invention is directed to an electronic circuit comprising at least one electrical device under test (DUT) embedded in the electronic circuit, the device under test including electrical contact points which are electrically connected to the electronic circuit, such that at least one electrical contact point of the at least one electrical device under test is configured with a switch, wherein the switch comprises: one first electrical contact which is electrically connected to an electrical contact point of the electrical device under test; a second electrical contact which is configured for electrically connecting to a measurement port of a vector network analyzer; and a third electrical contact which is electrically connected to the electronic circuit, wherein the switch is configured such that, with the second electrical contact free and electrically connected to nothing, the switch makes an electrical connection between the first and the third electrical contacts, wherein an electrical connection between the second electrical contact, on one side, and the first and third electrical contacts, on the other side, is broken, and that, with the second electrical contact electrically connected to the measurement port of the vector network analyzer, the switch breaks the electrical connection between the third and first electrical contacts and makes an electrical connection between the first and second electrical contacts, wherein an electrical connection between the third electrical contact and the second electrical contact is broken.

In a third aspect, the present invention is directed to a measurement apparatus comprising: a calibration substrate having at least one calibration standard comprising at least two electrical connection points, each for one measurement port of a vector network analyzer, at least one of the at least two electrical connection points of the at least one calibration standard including a switch, wherein the switch comprises: one first electrical contact which is electrically connected to an electrical connection point of the calibration standard; a second electrical contact which is configured for electrically connecting to a measurement port of the vector network analyzer; and a third electrical contact, wherein the switch is configured such that with the second electrical contact free and electrically connected to nothing, the switch makes an electrical connection between the first and third electrical contacts; wherein an electrical connection between the second and first electrical contacts and between the second and third electrical contacts is broken, and that with the second electrical contact electrically connected to the measurement port of the vector network analyzer, the switch breaks the electrical connection between the third and first electrical contacts and makes an electrical connection between the first and second electrical contacts, wherein an electrical connection between the third electrical contact and the second electrical contact is broken; and an electronic circuit comprising at least one electrical device under test (DUT) embedded in the electronic circuit, the device under test including electrical contact points which are electrically connected to the electronic circuit, such that at least one electrical contact point of the at least one electrical device under test is configured with a switch, wherein the switch comprises: one first electrical contact which is electrically connected to an electrical contact point of the electrical device under test; a second electrical contact which is configured for electrically connecting to a measurement port of a vector network analyzer; and a third electrical contact which is electrically connected to the electronic circuit, wherein the switch is configured such that, with the second electrical contact free and electrically connected to nothing, the switch makes an electrical connection between the first and the third electrical contacts, wherein an electrical connection between the second electrical contact, on one side, and the first and third electrical contacts, on the other side, is broken, and that, with the second electrical contact electrically connected to the measurement port of the vector network analyzer, the switch breaks the electrical connection between the third and first electrical contacts and makes an electrical connection between the first and second electrical contacts, wherein an electrical connection between the third electrical contact and the second electrical contact is broken; wherein at least one switch of the calibration substrate and at least one switch of the electronic circuit which are assigned to the same measurement port of the vector network analyzer have identical electrical properties.

In a fourth aspect, the present invention is directed to a method for determining scattering parameters of an electrical device under test (DUT) having one or more electronic components that are electrically connected to one another, with a vector network analyzer, wherein the electrical device under test includes, and is embedded within, an electronic circuit, wherein at least one port of the vector network analyzer is electrically connected to a calibration substrate which comprises at least one calibration standard, and the vector network analyzer is calibrated, wherein subsequently the calibration substrate is disconnected from the vector network analyzer and the at least one port is electrically connected to an electrical contact point of the electronic circuit, such that the at least one port of the vector network analyzer is electrically connected to the calibration substrate by at least one switch which is integrated into the calibration substrate, and the at least one port of the vector network analyzer is electrically connected to the electronic circuit by at least one switch which is integrated into the electronic circuit, wherein the at least one switch integrated into the calibration substrate and the at least one switch integrated into the electronic circuit, which are each associated with the same port of the vector network analyzer, have identical electrical properties.

One or more calibration standards may be arranged on the calibration substrate, and at least one switch is associated with each calibration standard. At least one switch may be arranged on the electronic circuit between the electrical device under test and the electronic circuit, in which the electrical device under test is embedded.

The method may further include arranging a switch on the electronic circuit, in each case, on at least one, or all, electrical contact points between the electrical device under test and the electronic circuit.

On electrical connection of the ports of the vector network analyzer to a respective switch, the switch breaks an electrical connection between the electrical device under test and the electronic circuit and makes an electrical connection between the electrical device under test and the respective port of the vector network analyzer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
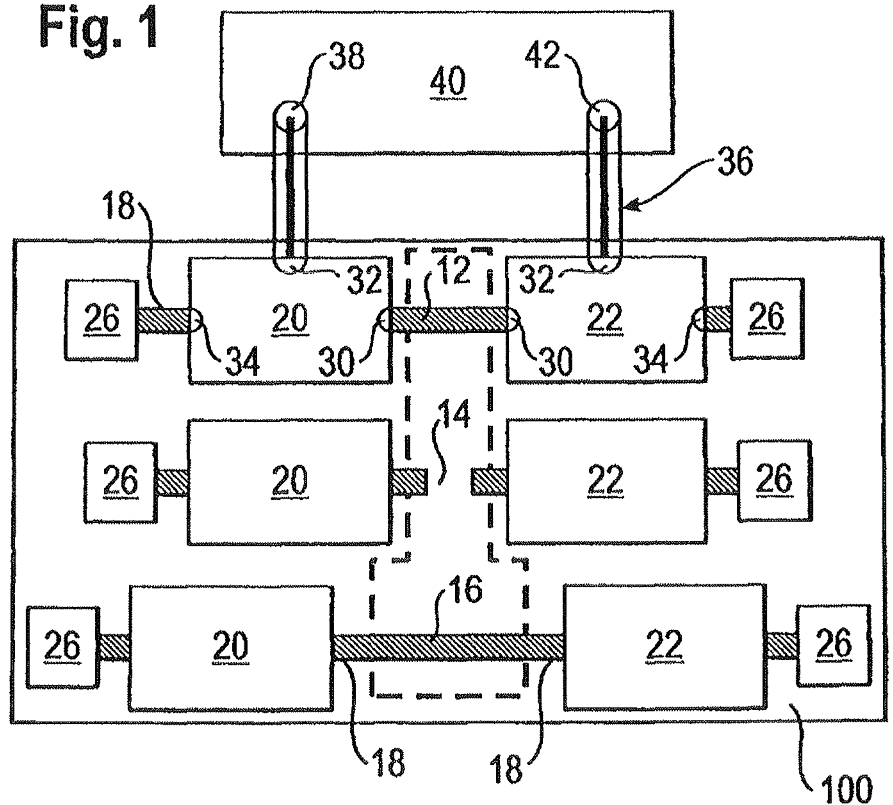
FIG. 1 shows a schematic arrangement of a first preferred embodiment of a calibration substrate according to the invention with switches.

In describing the preferred embodiment of the present invention, reference will be made herein to FIGS. 1-11 of the drawings in which like numerals refer to like features of the invention.

In a calibration substrate of the aforementioned type, it is provided according to the invention that at least one electrical connection point of at least one calibration standard is configured with a switch, wherein the switch comprises one first electrical contact which is electrically connected to an electrical connection point of the calibration standard, a second electrical contact which is configured for electrically connecting to a measurement port of the vector network analyzer, and a third electrical contact, wherein the switch is configured such that with the second electrical contact free and electrically connected to nothing, the switch makes an electrical connection between the first and the third electrical contacts, wherein an electrical connection between the second and first electrical contacts and between the second and third electrical contacts is broken, and that with the second electrical contact electrically connected to a measurement port of the vector network analyzer, the switch breaks the electrical connection between the third and first contacts and makes an electrical connection between the first and second electrical contacts, wherein an electrical connection between the third electrical contact and the second electrical contact is broken.

This has the advantage that a plurality of calibration standards can be arranged on one calibration substrate, wherein the measurement port of the vector network analyzer can always be connected to exactly one calibration standard.

In a preferred embodiment, the calibration substrate is configured as a circuit board, printed circuit board or wafer and the calibration standard is configured with the at least one switch as an integrated circuit on the circuit board, the printed circuit board or the wafer.

For termination of the third electrical contact with predetermined wave impedance, from an HF technology standpoint, in a preferred embodiment, the third electrical contact of the switch is electrically connected to an HF terminating resistor or a power transition.

Suitably, the switch is configured such that switching over of the electrical connections when the second contact is connected to or disconnected from the measurement port of the vector network analyzer is performed electrically, mechanically or optically.

In a preferred embodiment, the switch is configured such that switching over of the electrical connections when the second contact is connected to or disconnected from the measurement port of the vector network analyzer is performed by applying a predetermined electrical voltage.

With an electronic circuit of the aforementioned type, it is provided according to the invention that at least one electrical contact point of at least one electrical device under test is configured with a switch, wherein the switch comprises a first electrical contact which is electrically connected to an electrical contact point of the electrical device under test, a second electrical contact, which is configured for electrically connecting to a measurement port of a vector network analyzer, and a third electrical contact which is electrically connected to the electronic circuit, wherein the switch is configured such that, with the second electrical contact of the switch free and electrically connected to nothing, the switch makes an electrical connection between the first and the third electrical contacts, wherein an electrical connection between the second electrical contact, on one side, and the first and third electrical contacts, on the other side, is broken, and that with the second electrical contact electrically connected to a measurement port of the vector network analyzer, the switch breaks the electrical connection between the third and first contacts and makes an electrical connection between the first and second electrical contacts, wherein an electrical connection between the third electrical contact and the second electrical contact is broken.

This has the advantage that the vector network analyzer can be electrically connected directly to the electrical device under test embedded in the electronic circuit without electrical contact with the electronic circuit and without having to detach the electrical device under test mechanically from the electronic circuit, so that the scattering parameters of the electrical device under test can be determined independently of the electrical properties of the remainder of the electronic circuit.

In a preferred embodiment, the electronic circuit, the at least one electrical device under test and the at least one switch are configured as an integrated circuit on a circuit board, a printed circuit board or a wafer.

Suitably, the switch is configured such that switching over of the electrical connections when the second contact is connected to or disconnected from the measurement port of the vector network analyzer is performed electrically, mechanically or optically.

In a preferred embodiment, the switch is configured such that switching over of the electrical connections when the second contact is connected to or disconnected from the measurement port of the vector network analyzer is performed by applying a predetermined electrical voltage.

In a measurement arrangement of the aforementioned type, it is provided according to the invention that the switch of the calibration substrate and the switch of the electronic circuit which are assigned to the same port of the vector network analyzer have identical electrical properties.

This has the advantage that the calibration effort is minimized, since all the electrical devices under test of a circuit can be characterized using only one calibration substrate. The result is unambiguous measurement results, since the switches or their electrical properties are also taken into account when the vector network analyzer is calibrated.

Suitably, all the switches of the calibration substrate and the electronic circuit have identical electrical properties.

In a preferred embodiment, the switches with identical electrical properties also have identical mechanical properties. In particular, the switches with identical electrical properties are identically configured.

In a particularly preferable manner, the electronic circuit and the calibration substrate are configured on the same circuit board, the same printed circuit board or the same wafer.

In a method of the aforementioned type, the at least one port of the vector network analyzer is electrically connected to the calibration substrate by means, respectively, of at least one switch integrated into the calibration substrate and the at least one port of the vector network analyzer is electrically connected to the electronic circuit by means, respectively, of at least one switch integrated into the electronic circuit, wherein the at least one switch integrated into the calibration substrate and the at least one switch integrated into the electronic circuit, which are each associated with the same port of the vector network analyzer, have identical electrical properties.

This has the advantage that the calibration effort involved is minimized, since all the electrical devices under test of a circuit can be characterized using only one calibration standard.

In a preferred embodiment, one or more calibration standards are arranged on the calibration substrate, wherein at least one, particularly two, switches are associated with each calibration standard.

Since the at least one switch is arranged on the electronic circuit between the electrical device under test and the electronic circuit in which the electrical device under test is embedded, the scattering parameters of the electrical device under test can be determined independently of, and isolated from, the electrical properties of the remainder of the electronic circuit.

Suitably, a switch is arranged on the electronic circuit, in each case, on at least one, particularly two or all, electrical contact points between the electrical device under test and the electronic circuit.

A simple, rapid and functionally reliable electrical connection of high electrical quality, particularly with regard to the HF quality, is achieved in that, on electrical connection of the ports of the vector network analyzer to a respective switch, said switch breaks an electrical connection between the electrical device under test and the electronic circuit and makes an electrical connection between the electrical device under test and the respective port of the vector network analyzer.

In a preferred embodiment, the switches of the calibration substrate and of the electronic circuit having identical electrical properties are also configured with identical mechanical properties.

Suitably, the switches of the calibration substrate and of the electronic circuit with identical electrical properties are identically configured.

In a preferred embodiment, an electronic microswitch is used as the switch.

Suitably, the switching over of the electrical connections when the second contact is connected to or disconnected from the measurement port of the vector network analyzer is performed electrically, mechanically or optically.

In a preferred embodiment, the switching over of the electrical connections when the second contact is connected to or disconnected from the measurement port of the vector network analyzer is performed by applying a predetermined electrical voltage.

The first preferred embodiment of a calibration substrate 100 according to the invention shown in FIG. 1 in the form of a planar TLR (Thru-Line-Reflect) calibration substrate comprises three calibration standards 12, 14 and 16, which are configured, for example, as printed circuits on the calibration substrate 100. Each calibration standard 12, 14 and 16 is electrically connected by first waveguides 18 to a first switch 20 and a second switch 22. Each switch 20, 22 is, in turn, electrically connected to a terminating resistor 26. The first waveguide 18 is, for example, a planar waveguide.

Figure 2:
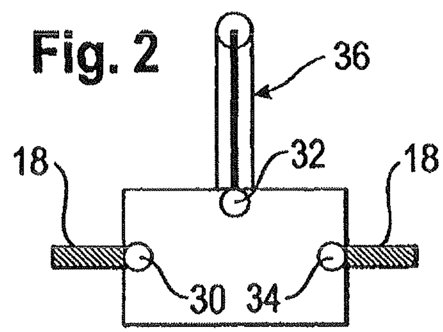
FIG. 2 shows a schematic representation of a first preferred embodiment of a switch.
Figure 3:
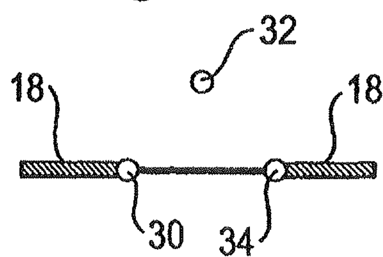
FIG. 3 shows a schematic representation of the switch of FIG. 2 in a first switching state.
Figure 4:
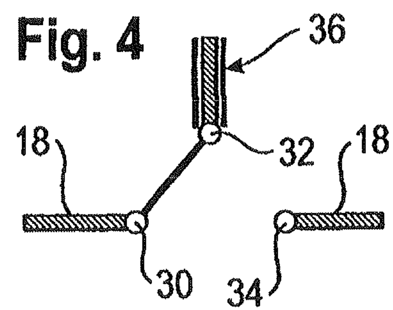
FIG. 4 shows a schematic representation of the switch of FIG. 2 in a second switching state.

As shown by FIGS. 2 to 4, each switch 20, 22 comprises a first electrical contact 30, a second electrical contact 32 and a third electrical contact 34. The first electrical contact 30 is electrically connected by first waveguide 18 to the calibration standard 12, 14, 16. The third electrical contact 34 is also electrically connected by first waveguide 18 to the terminating resistor 26. The second electrical contact 32 is electrically connectable optionally to a second waveguide 36 which is configured, for example, as a coaxial waveguide. Part of the second waveguide 36 is possibly configured on the calibration substrate 100.

As FIG. 1 shows, the second electrical contact 32 of the first switch 20 is optionally connectable to a first measurement port 38 of a vector network analyzer 40 and the second electrical contact 32 of the second switch 22 is optionally connectable to a second measurement port 42.

The switches 20, 22 are configured such that, as shown in FIG. 3, in a first switching position or basic position, in which the second contact 32 is free, i.e., the second contact is not electrically connected to a measurement port 38 or 42 of the vector network analyzer 40, the first contact 30 is electrically connected to the third contact 34. At the same time, the second electrical contact 32 is electrically disconnected from the first and third electrical contacts 30, 34, wherein an electrical insulation damping that is sufficient for the application is provided between the first and third electrical contacts 30, 34 and between the second and third electrical contacts 32, 34 by the switch 20, 22.

As soon as the second electrical contact 32 is electrically connected, by the second waveguide 36, to a measurement port 38 or 42 of the vector network analyzer 40, the switch 20, 22 switches over into the switching position shown in FIG. 4. The electrical connection between the first and third electrical contacts 30, 34 is thus broken and, in its place, the first electrical contact 30 is electrically connected to the second electrical contact 32. At the same time, the third electrical contact 34 is electrically disconnected from the first and second electrical contacts 30, 32, wherein an electrical insulation damping that is sufficient for the application is provided between the first and third electrical contacts 30, 34 and between the second and third electrical contacts 32, 34 by the switch 20, 22. In this way, therefore the respective measurement port 38, 42 is created by the switch 20, 22 with a respective electrical connection of the respective calibration standard 12, 14, 16 on the calibration substrate 100 by a simple electrical connection of one of the measurement ports 38, 42 or a second waveguide 36 to one of the second electrical contacts 32.

Figure 5:
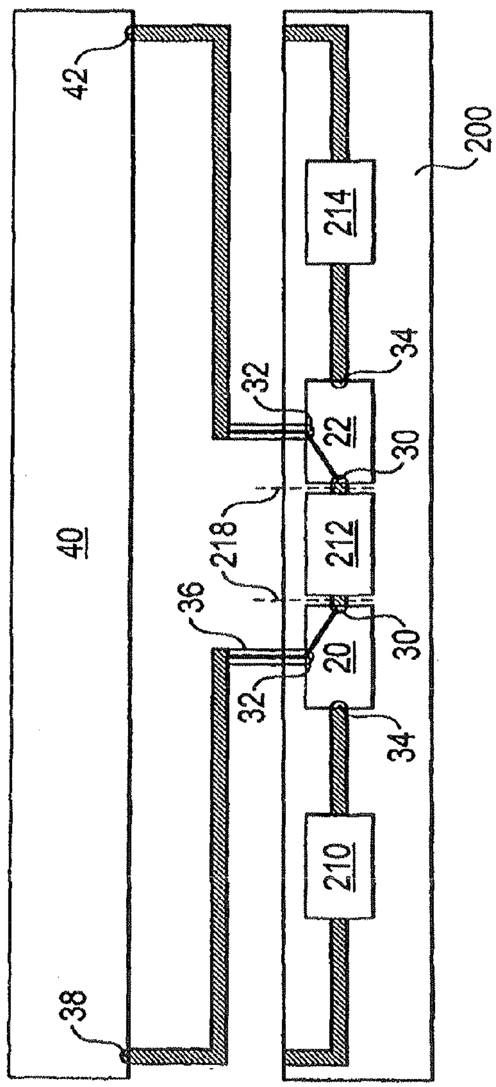
FIG. 5 shows a schematic representation of a first preferred embodiment of an electronic circuit according to the invention with electrical devices under test.

In FIG. 5, parts having the same function are identified with the same reference signs as in FIGS. 1 to 4, and for this reason, reference is made to the description above relating to FIGS. 1 to 4 for an explanation of these. FIG. 5 shows a first preferred embodiment of an electronic circuit 200, which is configured in the form of a planar circuit in which a plurality of devices under test (DUTs) 210, 212, 214 are embedded. The second DUT 212 is to be characterized by the vector network analyzer 40. Switches 20, 22 are embedded in the electronic circuit 200, wherein the first contacts 30 of the switches 20, 22 are each connected to the DUT 212 and the third contacts 34 of the switches 20, 22 are each connected to the circuit 200. The reference sign 218 refers to a reference plane.

Since the properties of the switches 20, 22 are taken into account during the calibration, as explained above by reference to FIGS. 1 to 4, the same switches 20, 22 must also be taken into account during the characterizing of the DUT 212. The expression "same switch" herein means switches with at least the same electrical properties, wherein preferably, the switches 20, 22 in the electronic circuit 200 are configured identically to the switches 20, 22 in the calibration substrate 100. The switches 20, 22 are implemented in all the feed lines from the DUT 212 to be tested to the remainder of the circuit 200, as shown in FIG. 5. The switches are installed such that they enable a connection between the measurement ports 38, 42 of the vector network analyzer 40 and the DUT to be characterized (in this case DUT 212). Following the characterization or error checking of the DUT 212, the switches 20, 22 remain in the circuit 200. As soon as the electrical connection between the measurement ports 38, 42 of the vector network analyzer 40 and the second contacts 32 of the switches 20, 22 is broken, the respective switch 20, 22 connects the DUT 212 to the other, adjacent parts of the circuit 200 again, specifically the DUTs 210, 224, as previously described in relation to FIGS. 3 and 4.

Figure 6:
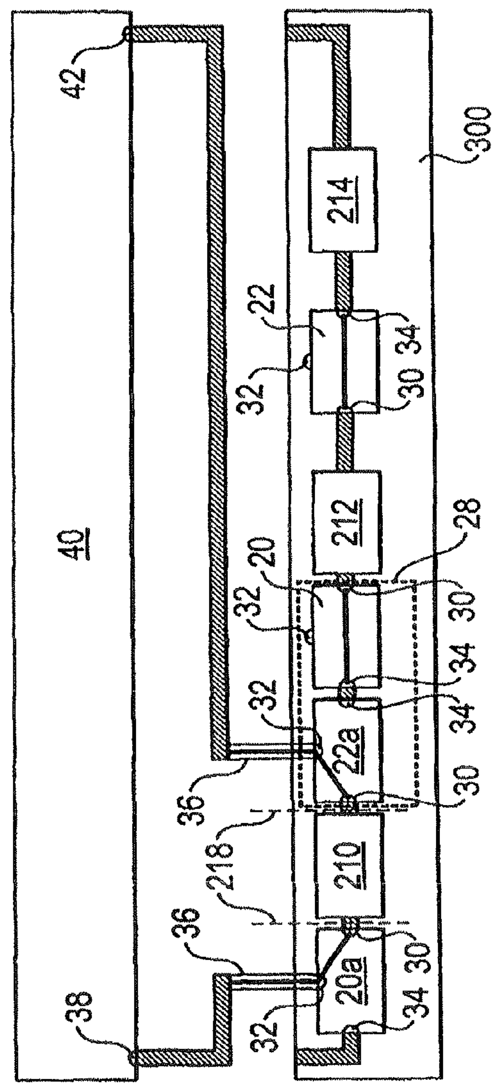
FIG. 6 shows a schematic representation of a second preferred embodiment of an electronic circuit according to the invention with electrical devices under test.

Using the same calibration substrate 100 of FIG. 1, all the other DUTs 210, 214 of the planar circuit 200 can also be characterized. For this purpose, a respective switch 20, 22 must simply be placed in each feed line of the DUT 210, 214 to be tested. An example for the characterizing of the DUT 210 is shown in FIG. 6. In FIG. 6, parts having the same function are identified with the same reference signs as in FIGS. 1 to 5, and for this reason, reference is made to the description above relating to FIGS. 1 to 5 for an explanation of these. FIG. 6 shows a second preferred embodiment of an electronic circuit 300 in the form of a planar circuit, wherein as distinct from the first preferred embodiment as per FIG. 5, additional switches 20*a* and 22*a* are arranged on both sides of the DUT 210. These switches 20*a* and 22*a* are configured identically to the switches 20 and 22. For characterizing of the DUT 210, the measurement ports 38 and 42 of the vector network analyzer 40 are electrically connected to the second electrical contacts 32 of the switches 20*a* and 22*a* instead of the second electrical contacts 32 of the switches 20 and 22.

The use of the switches 20, 20*a*, 22, 22*a* means that the electrical periphery, such as the other DUTs 212 and 214 and the other DUTs 210, 214 of the remainder of the circuit 200 or 300, has no influence on the measurement and characterizing of the DUT 210 or 212. A precondition for a precise measurement is that the switches 20, 20*a* and/or the switches 22, 22*a* have properties which are as identical as possible during the calibration, on the one hand, as shown in FIGS. 1 to 4 and the measurement, on the other hand, as shown in FIGS. 5 and 6 and particularly identical electrical properties. The insulation damping between the respective electrical contacts 32 and 34 should be as great as possible. The second electrical contacts 32 of the switches 20 and 22 are free, i.e., they are not electrically connected to a measurement port 38, 42 of a vector network analyzer 40. This means that the switches 20, 22 each make an electrical connection between the first electrical contact 30 and the third electrical contact 34.

The signal energy is transferred by the switches 20, 20*a*, 22, 22*a* from the vector network analyzer 40 to the respective calibration element 12, 14, 16 or the respective DUT 210, 212, 214. The calibration substrate 100 comprises a variety of calibration elements 12, 14, 16 (for example, a short-circuit standard, an open circuit standard, a resistance standard, a conductor standard, etc.), wherein the calibration elements 12, 14, 16 per measurement port are connected to the first waveguide 18 (e.g. microstrip line, coplanar line, etc.), wherein the first waveguide 18 is itself connected to a change-over switch or signal switch 20, 22. The change-over switch or signal switch 20, 22 is terminated with a terminating impedance $Z_{ab}$.

Other devices under test or verification standards can be arranged, as desired, on the calibration standard 100 for checking the calibration. The calibration elements 12, 14, 16 generally have N ports, N first waveguides 18, and at least N switches 20, 22 (at least one switch per first waveguide 18), wherein for each port, the first waveguides 18 and switches 20, 22 can differ with regard to the geometry and position thereof on the calibration substrate. The purpose of the switches 20, 20*a*, 22, 22*a* is the connection of the individual measurement ports 38, 42 of the vector network analyzer 40 to the calibration/verification standard 12, 14, 16 or to the devices under test (DUTs) 210, 212, 214, so that the surrounding line-connected periphery of the remainder of the electronic circuit 200, 300 has no influence on the measurement results. The function of the switch 20, 20*a*, 22, 22*a* has already been described making reference to FIGS. 2 and 4. The switch 20, 20*a*, 22, 22*a* can have any required appearance or form. It is important, however, that said switch has the described function and that at least the switches 20, 20*a* or 22, 22*a* associated with a particular measurement port 38 or 42 have identical electrical properties or are identically constructed. The switches 20, 20*a*, 22, 22*a* of different measurement ports 38, 42 can be configured differently and can have different electrical properties. The description above with identical switches 20, 20*a*, 22, 22*a* at all the measurement ports 38, 42 is purely exemplary.

The switches 20, 20*a*, 22, 22*a* can also be made up from different switches.

Figure 7:
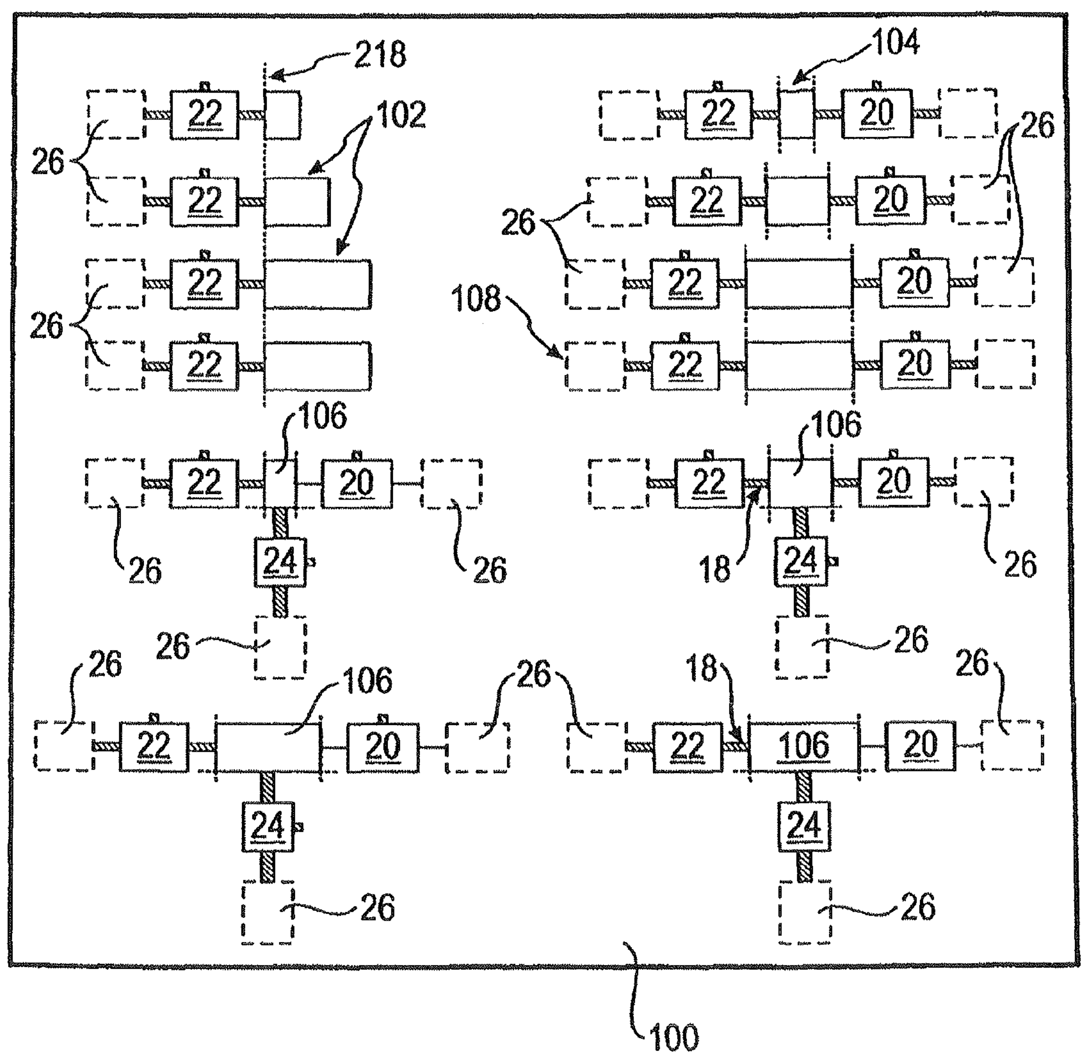
FIG. 7 shows a schematic representation of a second preferred embodiment of a calibration substrate according to the invention with switches.

The calibration substrate 100 is configured, for example, as a printed circuit board (PCB), wafer, etc., wherein the support material is produced from any solid, non-conductive or weakly conductive substrate material (such as, for example, glass, ceramics, FR4, Rogers RO 4003, epoxy material, etc.). The calibration substrate 100 is, for example, made as a multi-layer board from a plurality of substrate layers, wherein the switches 20, 20*a*, 22, 22*a* are arranged on the same substrate layer as the first waveguide 18. The arrangements/positions of the calibration standard 12, 14, 16 on the calibration substrate 100 or of the DUTs 210, 212, 214 on the electronic circuit 200, 300 are arbitrary. The positions and the embodiments of the switches 20, 20*a*, 22 and 22*a* and of the first waveguides 18 can be different for each of the N measurement ports of a calibration standard 12, 14, 16, but for all calibration standards 12, 14, 16 necessary for a calibration and for all DUTs 210, 212, 214, the first waveguide and the respective switch 20, 20*a*, 22, 22*a* must be identical per port, i.e. at least have identical electrical properties. FIG. 7 shows, by way of example, a calibration substrate 100 or an electronic circuit with different 1-port calibration standards/DUTs 102, 2-port calibration standards/DUTs 104 and 3-port calibration standards/DUTs 106. In FIG. 7, parts having the same function are identified with the same reference signs, as in FIGS. 1 to 6, and for this reason, reference is made to the description above relating to FIGS. 1 to 6 for an explanation of these. The 3-port calibration standard or the 3-port DUT 106 comprises, apart from the first switch 20 for the first port, which can be connected to the first measurement port 38 of the vector network analyzer 40, and the second switch 22 for the second port which can be connected to the second measurement port 42 of the vector network analyzer 40, in addition, a third switch 24 which can be connected to a corresponding third measurement port (not shown) of the vector network analyzer 40. The switches 24 are constructed and designed analogously to the switches 20 and 22. In other words, the description above of the switches 20, 22 applies similarly for the third switch 24. Arranged, for example, on the calibration substrate 100 is a plurality of N-port calibration standards for various calibrations. 108 denotes a transition. If 102, 104 and 106 do not represent a calibration standard, but a DUT, in place of the terminating resistor 26, a transition to the remainder of a circuit or a power transition is possibly provided.

Figure 8:
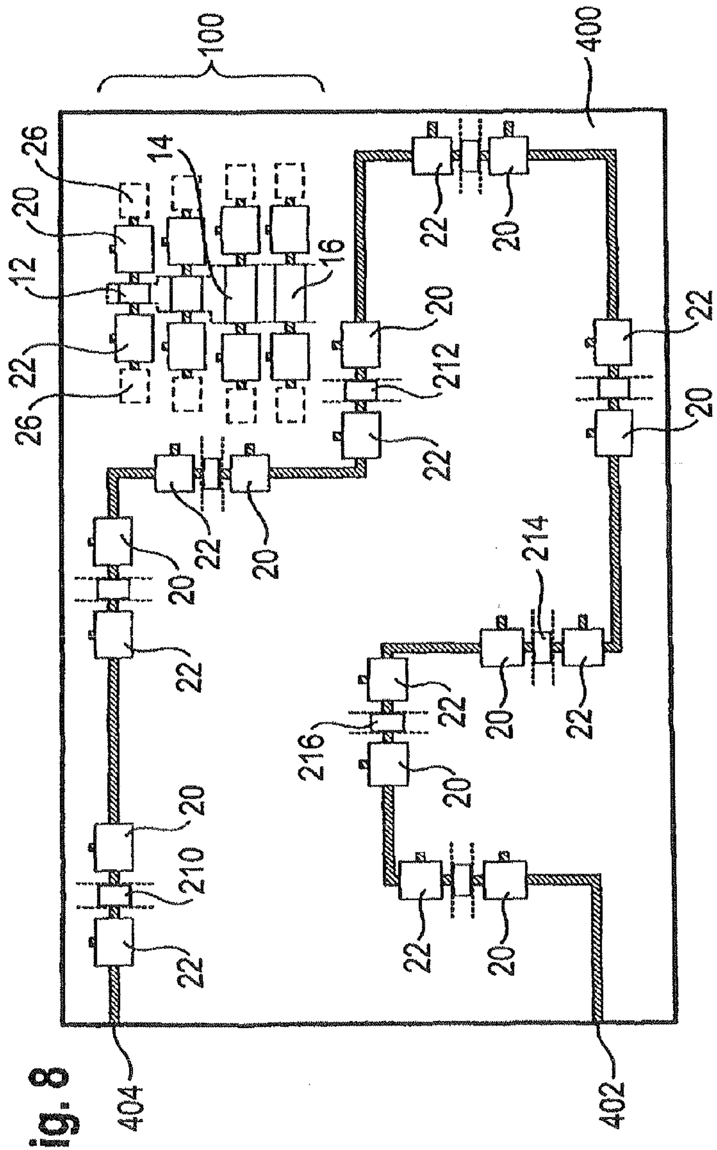
FIG. 8 shows a schematic representation of a preferred embodiment of a measurement arrangement according to the invention.

As shown in FIG. 8, by way of example, the calibration substrate 100 and the calibration elements 12, 14, 16 can be arranged together, along with user circuits containing the relevant DUTs 210, 212, 214, on one substrate 400. FIG. 8 shows a user circuit with an input/output 402 and an input/output 404. Otherwise, in FIG. 8, parts having the same function are identified with the same reference signs as in FIGS. 1 to 7, and for this reason, reference is made to the description above relating to FIGS. 1 to 7 for an explanation of these.

An auxiliary structure can extend along, but also transversely to, the first waveguide 18.

The switches 20, 22, 24 are preferably configured impedance-controlled. It is important that the greatest possible insulation damping is provided between the contacts 30, 32, 24 which are not electrically connected to one another. Preferably arranged at the end of the second waveguide 36 connected to the second electrical contact 32 there is a transition to another waveguide, such as a microstrip-coplanar transition, a microstrip-coaxial transition, a coplanar-coaxial transition, a coplanar-microstrip transition, and the like. In this way, the power input can take place, for example, by means of coaxial lines, PCB measuring probes or on-wafer measuring probes. The calibration substrate possibly has a base metal covering.

For practical operation, two switches 20, **20*a*, 22, 22*a* can be arranged together in a single housing. The two switches can then be configured as one switching structure. In FIG. 6, for example, the combination of switch 22*a* and switch 20 between the DUTs 210 and 212** would be one such switching structure.

The switch 20, 22, 24 is a three-port component. If the switch 20, 22, 24 is arranged between two waveguides which are electrically connected by means of the electrical contacts 30 and 34, said switch electrically connects the two waveguides. The switching over can take place automatically as soon as a further waveguide or a measurement port 38, 42 of a vector network analyzer 40 is electrically connected to the second contact 32 of the switch 20, 22, 24. If this further waveguide is removed again, the switch changes back to the original position. Alternatively, the switching over is carried out by other mechanisms. For example, the switching over can be carried out electrically, mechanically, or optically. The switch 20, 22, 24 can also be an active element. Then, for example, the switching process can be carried out by altering an applied voltage.

Figure 11:
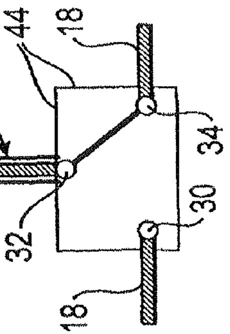
FIG. 11 shows a schematic representation of the switch of FIG. 9 in a third switching position.
Figure 10:
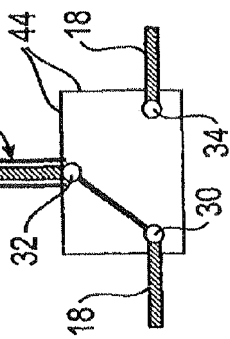
FIG. 10 shows a schematic representation of the switch of FIG. 9 in a second switching position.
Figure 9:
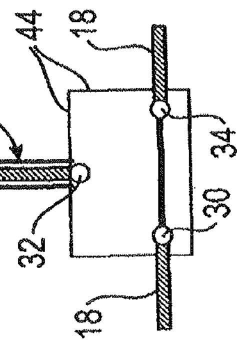
FIG. 9 shows a schematic representation of a second preferred embodiment of a switch in a first switching position.

It is also possible for the switch 20, 22, 24 to connect electrically every combination between the contacts 30, 32, 34 in pairs, including the second contact 32 to the third contact 34, which is controlled electrically, for example, by applying an electrical voltage 44, as shown in FIGS. 9 to 11. In FIGS. 9 to 11, parts having the same function are identified with the same reference signs as in FIGS. 1 to 8, and for this reason, reference is made to the description above relating to FIGS. 1 to 8 for an explanation of these. In FIG. 9, for example, an electrical voltage 44 of zero volts (0 V) is applied, in FIG. 10, for example, an electrical voltage 44 of negative five volts (−5 V) is applied and in FIG. 11, for example, an electrical voltage 44 of positive five volts (+5 V) is applied. In this way, for example, in FIG. 6, two switches **22*a* and 20 are grouped together to a single combined switch 28 which, on measuring the DUT 210 is assigned to the second measurement port 42 and, on measuring the DUT 212, is assigned to the first measurement port 38. Advantageously, an identical combined switch 28** is also arranged on the calibration substrate at the corresponding port of the respective calibration standard.

For correct measurement of the scattering parameters of an N-port, the measuring system must be calibrated. Depending on the calibration, M different N-port calibration standards (calibration elements), that are known or only partially known, are needed. For calibration using M calibration standards, the electrical properties of the switch 20, 22, 24 and of the first waveguide 18 and possibly also the second waveguide 36 must be identical for each port, although they can be different between the N-ports.

For example, the scattering parameters of a 2-port object are to be measured. For LLR (TRL) calibration, three 2-port calibration standards are needed. These can be, for example, two lines of different length and two short-circuits, wherein the short-circuits each represent a 1-port object, but together correspond to a 2-port object. The three 2-port standards can have two different feed lines (first waveguides 18) per port. The switches 20, 22, 24 can also have different properties, e.g., losses, at each feed line (each first waveguide 18). However, the first waveguides 18 and the switches 20, 22, 24 at the respective ports 1 of the calibration standards 12, 14, 16 and DUTs 210, 212, 214 must be identical. At port 2 of the calibration standard 12, 14, 16, the first waveguides 18 and the auxiliary structures must also match one another, but they can differ from those at port 1.

The invention also relates to a method for determining scattering parameters of an electrical device under test (DUT) which comprises one or more electronic components which are electrically connected to one another, using a vector network analyzer, wherein the electrical device under test is embedded in an electronic circuit, wherein at least one, particularly two, ports of the vector network analyzer are electrically connected to a calibration substrate which comprises at least one calibration standard, and the vector network analyzer is calibrated, wherein subsequently the calibration substrate is disconnected from the vector network analyzer and the at least one port is electrically connected to an electrical connection point of the electronic circuit, wherein the at least one port of the vector network analyzer is electrically connected to the calibration substrate by, in each case, at least one switch integrated into the calibration substrate and the at least one port of the vector network analyzer is electrically connected to the electronic circuit by means of at least one switch integrated into the electronic circuit, wherein the at least one switch integrated into the calibration substrate and the at least one switch integrated into the electronic circuit, which are respectively associated with the same port of the vector network analyzer, have identical electrical properties. This has the advantage that the calibration effort is minimized, since all the electrical devices under test of a circuit can be characterized using just one calibration substrate.

In a method according to one of the preceding paragraphs, one or more calibration standards are arranged on the calibration substrate, wherein at least one, and particularly two, switches are associated with each calibration standard.

In a method according to one of the preceding paragraphs, the at least one switch is arranged on the electronic circuit between the electrical device under test and the electronic circuit in which the electrical device under test is embedded. By this means, the scattering parameters of the electrical device under test can be determined independently and isolated from the electrical properties of the remainder of the electronic circuit.

In a method according to one of the preceding paragraphs, a switch is arranged on the electronic circuit at, in each case, at least one, particularly two or all, electrical contact points between the electrical device under test and the electronic circuit.

In a method according to one of the preceding paragraphs, a simple, quick and functionally reliable electrical connection of high electrical quality, particularly with regard to the HF quality, is achieved in that when the ports of the vector network analyzer are electrically connected to a respective switch, said switch breaks an electrical connection between the electrical device under test and the electronic circuit and makes an electrical connection between the electrical device under test and the respective port of the vector network analyzer.

In a method according to one of the preceding paragraphs, the switches of the calibration substrate and of the electronic circuit having identical electrical properties also have identical mechanical properties.

In a method according to one of the preceding paragraphs, all the switches of the calibration substrate and of the electronic circuit having identical electrical properties are identically configured.

In a method according to one of the preceding paragraphs, an electronic microswitch is used as the switch.

In a method according to one of the preceding paragraphs, the switching over of the electrical connections on connection of the second contact to, or separation of the second contact from, the measurement port of the vector network analyzer is carried out electrically, mechanically, or optically.

In a method according to one of the preceding paragraphs, the switching over of the electrical connections on connection of the second contact to, or separation of the second contact from, the measurement port of the vector network analyzer is carried out by applying a pre-determined electrical voltage.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A calibration substrate having at least one calibration standard comprising at least two electrical connection points, each for one measurement port of a vector network analyzer, at least one of said at least two electrical connection points of said at least one calibration standard including a switch, wherein the switch comprises:

one first electrical contact which is electrically connected to an electrical connection point of the calibration standard;

a second electrical contact which is configured for electrically connecting to a measurement port of the vector network analyzer; and a third electrical contact, wherein the switch is configured such that with the second electrical contact free and electrically connected to nothing, the switch makes an electrical connection between the first and third electrical contacts;

wherein an electrical connection between the second and first electrical contacts and between the second and third electrical contacts is broken, and that with the second electrical contact electrically connected to said measurement port of the vector network analyzer, the switch breaks the electrical connection between the third and first electrical contacts and makes an electrical connection between the first and second electrical contacts, wherein an electrical connection between the third electrical contact and the second electrical contact is broken.

2. The calibration substrate of claim 1, comprising a circuit board, printed circuit board, or wafer, or any combination thererof, and the calibration standard having the at least one switch as an integrated circuit on the circuit board, the printed circuit board, or the wafer, or any combination thereof.

3. The calibration substrate of claim 2, wherein the third electrical contact of the switch is electrically connected to an HF terminating resistor or a power transition.

4. The calibration substrate of claim 1, wherein the third electrical contact of the switch is electrically connected to an HF terminating resistor or a power transition.

5. The calibration substrate of claim 4 wherein the switch is configured such that switching over of the electrical connections, when the second electrical contact is connected to or disconnected from the measurement port of the vector network analyzer, is performed electrically, mechanically, or optically, or any combination thereof.

6. The calibration substrate of claim 4, wherein the switch is configured such that switching over of the electrical connections, when the second electrical contact is connected to or disconnected from the measurement port of the vector network analyzer, is performed by applying a predetermined electrical voltage.

7. The calibration substrate of claim 1 wherein the switch is configured such that switching over of the electrical connections, when the second electrical contact is connected to or disconnected from the measurement port of the vector network analyzer, is performed electrically, mechanically, or optically, or any combination thereof.

8. The calibration substrate of claim 1, wherein the switch is configured such that switching over of the electrical connections, when the second electrical contact is connected to or disconnected from the measurement port of the vector network analyzer, is performed by applying a predetermined electrical voltage.

9. An electronic circuit comprising at least one electrical device under test (DUT) embedded in the electronic circuit, said device under test including electrical contact points which are electrically connected to the electronic circuit, such that at least one electrical contact point of said at least one electrical device under test is configured with a switch, wherein the switch comprises:

one first electrical contact which is electrically connected to an electrical contact point of the electrical device under test;

a second electrical contact which is configured for electrically connecting to a measurement port of a vector network analyzer; and a third electrical contact which is electrically connected to the electronic circuit, wherein the switch is configured such that, with the second electrical contact free and electrically connected to nothing, the switch makes an electrical connection between the first and the third electrical contacts, wherein an electrical connection between the second electrical contact, on one side, and the first and third electrical contacts, on the other side, is broken, and that, with the second electrical contact electrically connected to said measurement port of the vector network analyzer, the switch breaks the electrical connection between the third and first electrical contacts and makes an electrical connection between the first and second electrical contacts, wherein an electrical connection between the third electrical contact and the second electrical contact is broken.

10. The electronic circuit of claim 9, wherein the electronic circuit, the at least one electrical device under test, and the at least one switch comprise an integrated circuit on a circuit board, a printed circuit board, or a wafer.

11. The electronic circuit of claim 10, wherein the switch is configured such that the switching over of the electrical connections, when the second electrical contact is connected to or disconnected from the measurement port of the vector network analyzer, is performed electrically, mechanically, or optically, or any combination thereof.

12. The electronic circuit of claim 10, wherein the switch is configured such that the switching over of the electrical connections, when the second electrical contact is connected to or disconnected from the measurement port of the vector network analyzer, is performed by applying a predetermined electrical voltage.

13. The electronic circuit of claim 9, wherein the switch is configured such that the switching over of the electrical connections, when the second electrical contact is connected to or disconnected from the measurement port of the vector network analyzer, is performed electrically, mechanically, or optically, or any combination thereof.

14. The electronic circuit of claim 9, wherein the switch is configured such that the switching over of the electrical connections, when the second electrical contact is connected to or disconnected from the measurement port of the vector network analyzer, is performed by applying a predetermined electrical voltage.

15. A measurement apparatus comprising:

a calibration substrate having at least one calibration standard comprising at least two electrical connection points, each for one measurement port of a vector network analyzer, at least one of said at least two electrical connection points of said at least one calibration standard including a switch, wherein the switch comprises:

one first electrical contact which is electrically connected to an electrical connection point of the calibration standard;

a second electrical contact which is configured for electrically connecting to a measurement port of the vector network analyzer; and a third electrical contact, wherein the switch is configured such that with the second electrical contact free and electrically connected to nothing, the switch makes an electrical connection between the first and third electrical contacts;

wherein an electrical connection between the second and first electrical contacts and between the second and third electrical contacts is broken, and that with the second electrical contact electrically connected to said measurement port of the vector network analyzer, the switch breaks the electrical connection between the third and first electrical contacts and makes an electrical connection between the first and second electrical contacts, wherein an electrical connection between the third electrical contact and the second electrical contact is broken; and an electronic circuit comprising at least one electrical device under test (DUT) embedded in the electronic circuit, said device under test including electrical contact points which are electrically connected to the electronic circuit, such that at least one electrical contact point of said at least one electrical device under test is configured with a switch, wherein the switch comprises:

one first electrical contact which is electrically connected to an electrical contact point of the electrical device under test;

a second electrical contact which is configured for electrically connecting to a measurement port of a vector network analyzer; and a third electrical contact which is electrically connected to the electronic circuit, wherein the switch is configured such that, with the second electrical contact free and electrically connected to nothing, the switch makes an electrical connection between the first and the third electrical contacts, wherein an electrical connection between the second electrical contact, on one side, and the first and third electrical contacts, on the other side, is broken, and that, with the second electrical contact electrically connected to said measurement port of the vector network analyzer, the switch breaks the electrical connection between the third and first electrical contacts and makes an electrical connection between the first and second electrical contacts, wherein an electrical connection between the third electrical contact and the second electrical contact is broken;

wherein at least one switch of the calibration substrate and at least one switch of the electronic circuit which are assigned to the same measurement port of the vector network analyzer have identical electrical properties.

16. The measurement apparatus of claim 15, wherein all the switches of the calibration substrate and of the electronic circuit have identical electrical properties.

17. The measurement apparatus of claim 15, wherein the switches with identical electrical properties also have identical mechanical properties.

18. The measurement apparatus of claim 15, wherein the switches with identical electrical properties are identically configured.

19. The measurement apparatus of claim 15, wherein the electronic circuit and the calibration substrate are configured on the same circuit board, the same printed circuit board, or the same wafer.

* * * * *